United States Patent [19]

Rammelsberg

[11] Patent Number: 4,606,559

[45] Date of Patent: Aug. 19, 1986

[54] AXIALLY SECURE SLEEVE CONNECTION FOR SOCKET TUBES

[75] Inventor: Jurgen Rammelsberg, Herne, Fed. Rep. of Germany

[73] Assignee: Thyssen Industrie AG, Fed. Rep. of Germany

[21] Appl. No.: 659,340

[22] Filed: Oct. 10, 1984

[30] Foreign Application Priority Data

Oct. 11, 1983 [DE] Fed. Rep. of Germany ....... 3336855

[51] Int. Cl.$^4$ ............................................. F16L 35/00
[52] U.S. Cl. .................................... 285/39; 285/233; 285/308; 285/374
[58] Field of Search ............... 285/400, 399, 374, 322, 285/323, 223, 39, 308

[56] References Cited

U.S. PATENT DOCUMENTS

| | | |
|---|---|---|
| 2,177,184 | 10/1939 | Martin et al. |
| 3,684,320 | 8/1972 | Platzer et al. ................... 285/374 X |
| 4,178,023 | 12/1979 | Guest .................... 285/323 |
| 4,296,953 | 10/1981 | Nagao et al. ................... 285/374 X |
| 4,303,262 | 12/1981 | Pierrel ............................. 285/374 X |

FOREIGN PATENT DOCUMENTS

| | | |
|---|---|---|
| 2162435 | 6/1973 | Fed. Rep. of Germany . |
| 2016440 | 7/1974 | Fed. Rep. of Germany . |
| 1817319 | 6/1975 | Fed. Rep. of Germany . |
| 2205000 | 2/1978 | Fed. Rep. of Germany . |
| 3117225 | 11/1982 | Fed. Rep. of Germany ...... 285/374 |
| 106916 | 8/1979 | Japan ................................... 285/374 |

*Primary Examiner*—Dave W. Arola
*Attorney, Agent, or Firm*—McGlew and Tuttle

[57] ABSTRACT

A sleeve connector for connecting the ends of two tubes together, in particular socket tubes, comprises a socket formed with or connected to one of the tubes. The socket has an inner annular recess which is bounded by a conical surface which tapers radially inwardly toward an end of the socket. A retaining collar is secured around the spigot end of another tube to be connected to the first mentioned tube. At least one locking member is disposed around the spigot and is positioned in the annular recess so that it can bear against the conical surface. The locking member has an inner cylindrical contact surface which engages on the spigot and an outer contact surface which has a sectional toroidal shape wherein all normals to the toroidal shape pass through the cylindrical contact surface. In this way, all forces resulting from the contact between the outer surface of the locking member and the inner conical surface, are transmitted to the cylindrical inner surface of the locking member and flatly against the spigot.

17 Claims, 3 Drawing Figures

AXIALLY SECURE SLEEVE CONNECTION FOR SOCKET TUBES

FIELD AND BACKGROUND OF THE INVENTION

The present invention relates in general to connectors for connecting the ends of pipes and tubes together, and in particular to a new and useful sleeve connector which includes a socket part for one tube having a conical surface and a locking member having a cylindrical surface for engaging around the end of another pipe, and a toroidal surface for engagement against the conical surface of the socket.

In pressure tubes and fittings including sleeve connections, forces occur which result from the inside pressure and must be taken up at the end points, bends, or branching points either by the surrounding ground or by a proper locking. For transmitting very strong forces such as occurring in large-diameter pipelines or under high operating pressures, sleeve connections are employed which are secured against shift and in which a positive connection transmits the forces. For this purpose, the spigot of one tube to be introduced into the socket of another tube is provided with a retaining collar, mostly in the form of a weld deposit, and the socket end is provided with an annular recess in which a locking part is received.

In a prior art sleeve connection of this kind, (German Pat. No. 22 05 000), the annular recess has on its side close to the socket end a tapering surface and the annular locking part has a cooperating taper. This has the advantage that with any mismatching due to manufacturing tolerances, between the axially exactly aligned socket and spigot ends, the forces will be transmitted uniformly over the entire circumference of the locking part. However, such sleeve connections must also be capable of angling, within limits. That is even if there is a small angle between the tubes to be connected. In such instances, a full contact between the tapering surfaces is no longer ensured. With an angled connection and under strong lengthwise acting forces, high local force and stress peaks occur which may result in a failure of the shift security or even in a deformation of the spigot end.

In other prior art sleeve connections, attempts have been made to avoid such drawbacks by providing spherical surfaces for transmitting the forces, having common centers at locations where, in an angled position, the axes of the two tubes intersect (German Pat. Nos. 18 17 319 and 20 16 440 and German OS No. 21 62 435). A spherical joint thus formed transmits the axial forces uniformly over the entire circumference of the socket, even in an angled connection. However, this is true only for connections having exact nominal dimensions.

In practice, nominal dimensions are found in sockets and spigots to be connected to each other only on extremely rare occasions. Connections must be made for tubes having dimensions which, within permissible tolerances, depart from the nominal values. For example, with a nominal diameter of 400 mm, variations of up to 4 mm may occur. As a result of inaccuracies in dimensions, the centers of the spherical surfaces of the recess and the locking part are displaced relative to each other to an extent interrupting the continuous surface contact therebetween. Locally excessive forces and stresses are produced which are capable of deforming the spigot or shearing off the weld deposit thereon, with the result of a failure of the connection.

SUMMARY OF THE INVENTION

The present invention is directed to a connection of the above mentioned kind which eliminates the occurrence of stress peaks in any matching of spigot and socket ends of tubes having dimensions within tolerances, also under conditions of usual angling.

Accordingly, an object of the present invention is to provide a sleeve connector for connecting the ends of two tubes together, comprising, a socket for association with one tube to be connected, the socket having an annular recess bounded by a tapered and preferably conical surface tapering radially inwardly toward an end of the socket, a retaining collar adapted to be secured to another tube to be connected and for extending around the other tube adjacent an end of the other tube, and at least one locking member disposed in the socket recess and having a radially inner cylindrical contact surface for engagement on the other tube and a radially outer contact surface having a sectional toroidal shape for contact with the tapered surface, with all normals passing through the outer contact surface intersecting the inner cylindrical contact surface.

Due to this provision, with any usual angling and any usual manufacturing tolerances of tubes joined by a sleeve connection, the forces are transmitted from the socket to the end or spigot of the other tube in such a way that the radial force components between the locking part and the outer surface of the spigot end pass through the area of the cylindrical contact surface. Tilting moments producing the excessive local force or stress peaks, are securely prevented. With usual angled connections, it is made sure that always an at least linear continuous contact is obtained over the circumference between the conical surface of the recess of the socket and the toroidal portion of the locking part. That is why in such instances again, no undesirable force or stress peaks can occur, particularly if in accordance with a preferred embodiment of the invention, the diameter of the circular cross section of the toroidal surface is less than the axial length of the cylindrical contact surface of the locking part.

To eliminate peeling forces which, under an axially applying locking part, would act on the retaining collar which as known, may be formed by a deposited weld, the locking part may have on its side remote from the socket end a contact surface in the shape of a tapering recess. The taper then also produces radial forces which relieve the shearing forces acting on the collar.

To ensure that with a loaded sleeve connection, the locking part definitely applies against the introduced spigot and the retaining collar thereof, the angle of taper of the conical surface of the socket should be smaller than 45°, to make the radial forces acting on the locking part always stronger than the axial forces. Then, the locking part cannot slip over the retaining collar, not even under strong axial forces.

To obtain that only the toroidal surface portion of the locking part cooperates with the conical surface of the socket under any load, matching of parts, and angling, the annular surface adjacent the toroidal one in the direction of the socket end has a contour making sure that at any angle of connection between the socket and the spigot, the ends thereof remain spaced apart.

As known per se, the locking part is a resilient and split ring which must be inserted into the respective recess prior to introducing the spigot end. Therefore, the radial depth of the recess bounded by the conical surface must exceed the radial cross sectional height of the locking ring plus the radial height of the retaining collar, so that upon inserting the locking part into the recess, the spigot end with the retaining collar can be shifted into the socket until the collar has passed beyond the locking part and the locking part, under its resilience, applied against the spigot behind the retaining collar.

In another embodiment, the socket may be designed with a window which extends from the socket end into the annular recess, in which case the locking part is designed as a plurality of locking elements having a width, considered in the circumferential direction of the recess, substantially corresponding to the width of the window. This embodiment has the advantage that the spigot of a tube can be introduced into the socket of another tube in advance, while the locking elements are inserted subsequently, individually through the window into the recess where they are then shifted in the circumferential direction.

To facilitate such an introduction and shifting of the locking elements, each element may be designed with a tongue extending lengthwise of the spigot, beyond the socket end and through an annular gap which is formed between the socket end and the spigot. The tongues may carry on their upper side at least one projection for a tool to be engaged therewith.

Designs of sleeve connections in which the parts are first assembled and then locked, are known. U.S. Pat. No. 2,177,184 discloses such a connection in which two locking wedge members are introduced through two corresponding recesses provided in the front of the socket, and fixed in place by shifting them in the circumferential direction. German Pat. No. 20 16 440 discloses a construction in which two locking members are axially introduced through a frontal recess and then circumferentially displaced on the spigot. These prior art constructions have the drawback that the force transmitting portion of the circumference of the tube is reduced and the transmission is concentrated to two portions of this circumference. Especially in larger diameter tubes, such a concentration of forces may result in a failure of the locking before the wall of the tube has reached its limit load. To minimize the disturbance of the force transmission in the zone of the window and thus reduce the unfavorable distribution of the stress under load, a preferred embodiment of the present invention provides a radially extending web in the window forming two partial windows, and an introduction recess on the top of each locking element corresponding to the width of the web. This web reinforces the wall of the socket in the window zone, thus preventing undue stresses in this area. Favorable conditions are obtained by providing a width of the web and introduction recesses approximately corresponding to the width of each of the partial windows.

The web between the partial windows may also be utilized for transmitting axial forces, by interrupting the conical surface of the socket recess only in the area of the partial windows, and providing a height of the introduction channnels adjacent the partial windows corresponding to the largest radial depth of the recess. Then, the locking elements can be introduced individually and sequentially through the window into the recess. After having introduced the last locking element, all the locking elements are shifted through one half their individual width, so that the toroidal portion of the last inserted locking element can apply against the conical surface which is provided also in the area of the window web.

After being properly distributed, the locking elements may be secured in place on the circumference of the spigot by means of a retaining band or ring.

Another object of the invention is to provide a sleeve connector which is particularly useful for large diameter tubes and which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following, two embodiments of the invention are explained in more detail with reference to the accompanying drawings, in which.

DESCRIPTION OF THE PREFERRED EMBODIMENTS

Figure 1:
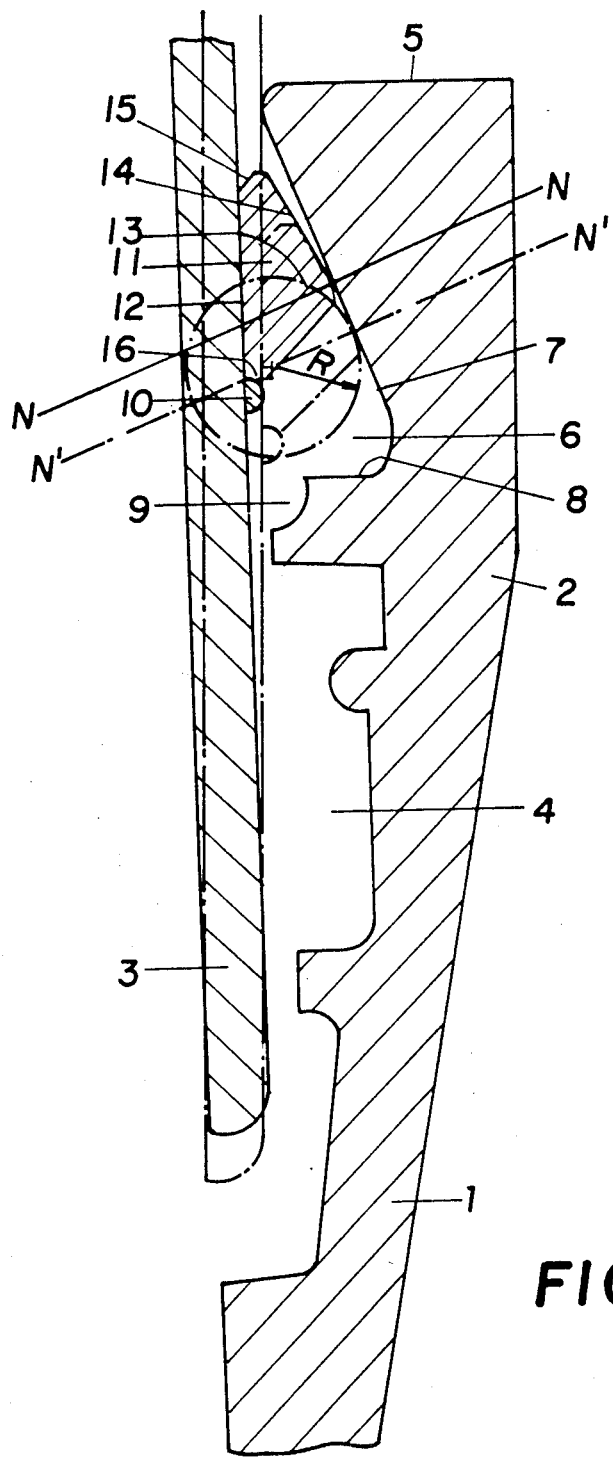
FIG. 1 is an axial sectional view of an inventive sleeve connection.

FIG. 1 shows a connection between a socket 2 of a tube 1, and a spigot 3 of another tube. At a certain distance from socket end 5, socket 2 is provided with an annular recess 4 in which a seal ring (not shown) is inserted as a packing for spigot 3.

Between recess 4 and socket end 5, another annular recess 6 is provided which is limited by a conical surface 7 on its side closer to socket end 5. Surface 7 tapers radially inwardly in a direction toward socket end 5. The angle of taper of conical surface 7, relative to the axis of socket tube 1, is smaller than 45°. For a standard tube size NW 800, for example, the angle ranges between 20° and 25°. In the direction of the seal ring for recess 4 (not shown), this recess 6 is limited by a circular stop surface 8 including a circular groove 9 disposed radially on the inside of surface 8.

A weld band is deposited on the spigot 3, as a retaining collar 10, at some distance from the end of spigot 3.

The connection is secured against shift by a locking part 11, which, in the shown embodiment, is formed by a resilient slit ring. Locking part 11 has a cylindrical contact surface 12, which in assembled state, applies against the outer circumference of spigot 3. Part 11 has further a curved contact surface 13 which cooperates with conical surface 7 and is designed as a portion of a toroidal surface. In the direction of socket end 5, this toroidal portion is followed by an annular surface 14 of locking part 11, having a contour such that conical surface 7 and surface 14 remain spaced apart at any angled position between socket 2 and spigot 3. In the embodiment of FIG. 1, annular surface 14 is designed as a conical surface having a larger angle of taper (relative to the longitudinal axis of socket 2) than conical surface 7.

The shown sleeve connection is assembled as follows:

First, locking part 11 is inserted into recess 6. Then, spigot 3 of the tube to be connected is introduced. During this introduction, initially the cylindrical contact surface 12 of locking part 11 slides over the surface of spigot 3 until collar 10 of the spigot 3 butts against locking part 11. Due to an annular beveled surface 15 in the shape of an internal taper provided on locking part 11, the locking part surmounts collar 10 which then passes behind it. Locking part 11 bears against stop surface 8 of recess 6 until collar 10 engages groove 9. Then, locking part 11 (made of resilient material) resiliently applies against spigot 3. If now spigot 3 is pulled back in the direction of socket end 5, the position shown in FIG. 1 in solid lines is reached, in which collar 10 bears against an internal taper 16 having an angle of taper of about 85°, relative to the tube axis, while the toroidal portion 13 applies against conical surface 7. The shown position corresponds to the operating position of socket 2 and spigot 3 in coaxial alignment.

The solid lines show socket 2 and spigot 3 aligned with each other. The broken lines show a position in which socket 2 and spigot 3 form an angle of about 2°. It may be learned therefrom that in any position, an at least linear contact exists between the toroidal surface portion 13 of locking part 11 and conical surface 7 of recess 6. Since, in addition, the design of surface portion 13 and of the angle of taper of surface 7 are such that all normals to surface portion 13 (two normals N,N' are shown in FIG. 1) intersect with cylindrical contact surface 12 of locking part 11 applying against spigot 3. The forces acting on locking part 11 radially are always stronger than those acting axially which, therefore, also cannot cause any tilting of locking part 11. FIG. 1 further shows in broken lines the axial section circle R of a toroidal surface of which surface 13 is a portion.

Figure 2:
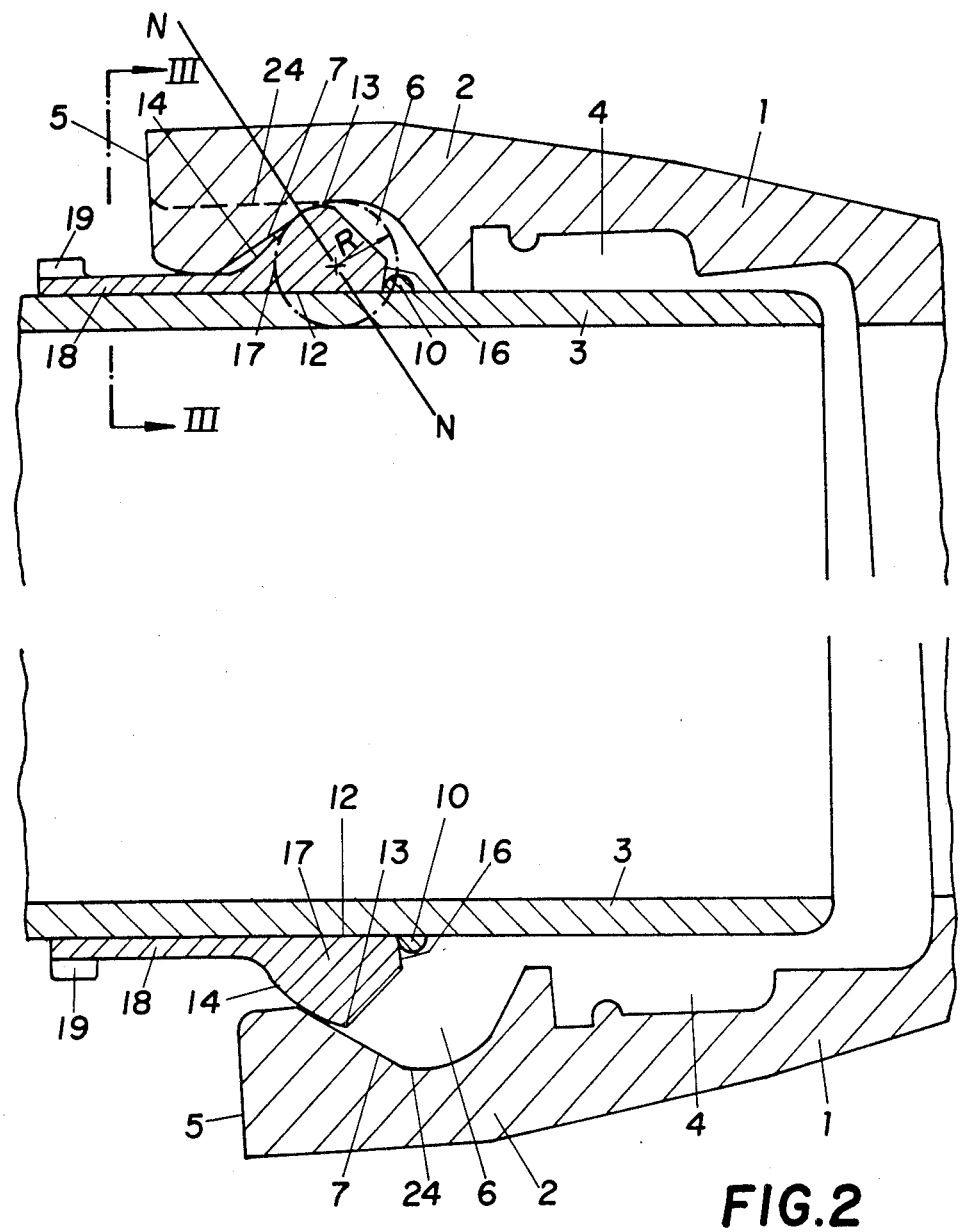
FIG. 2 is another embodiment of the connection of FIG. 1.
Figure 3:
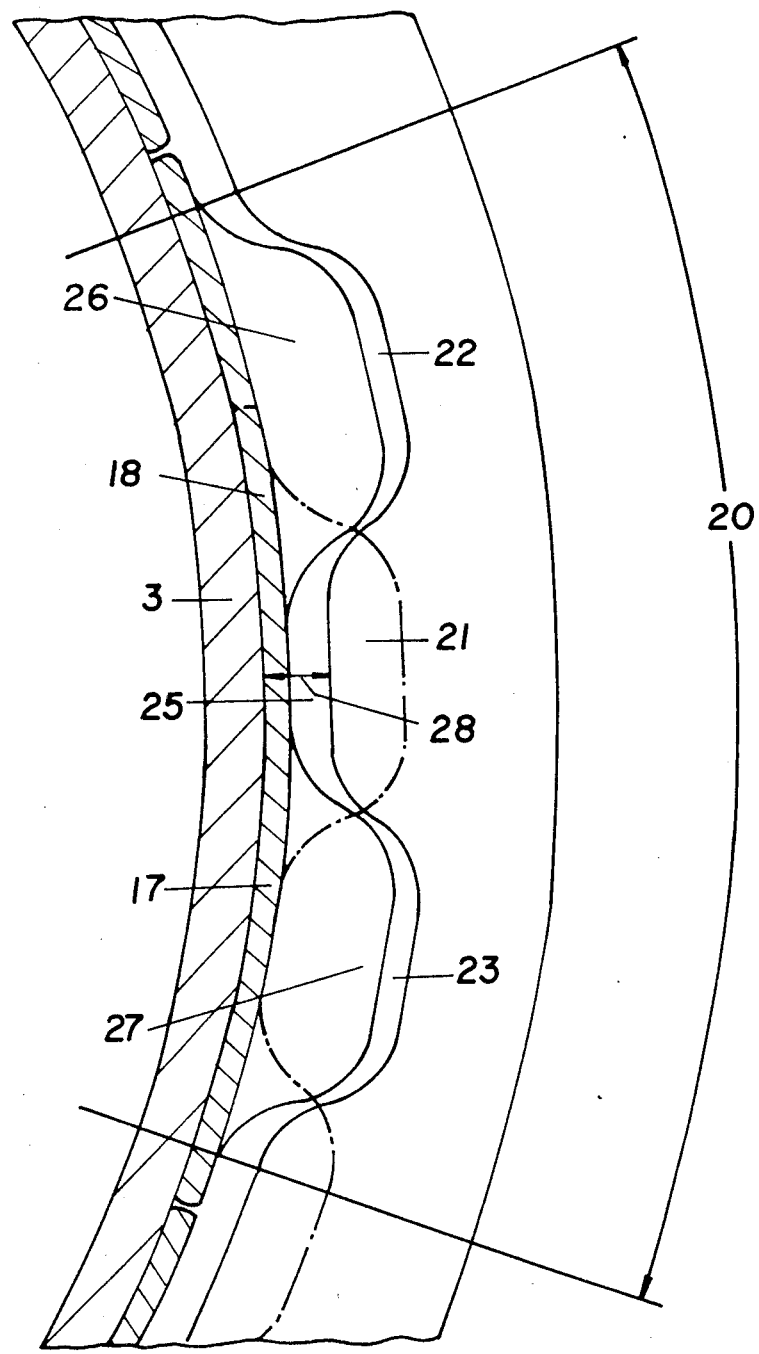
FIG. 3 is a sectional view taken along the line III—III of FIG. 2.

In the other embodiment shown in FIGS. 2 and 3, like reference numerals are used for the same or similar elements.

Unlike the embodiment of FIG. 1, the locking part is formed by a plurality of, in this example 8, locking elements 17 extending each over ⅛th of the circumference of spigot 3. Toroidal contact surface 13 along with annular surface 14 have together an S shaped cross section. The axial sectional circle R of the toroidal surface is shown in broken lines in FIG. 2. Each of locking elements 17 comprises a tonge 18 which extends in the direction of, and beyond, socket end 5, and bearing by its underside against the surface of spigot 3, which enlarges the cylindrical contact surface 12. Tongues 18 each carry a projection 19 which may be designed to engage a tool for moving locking element 17 in recess 6 in the circumferential direction. Also, tongues 18 extend beyond socket end 5, so that they may be fixed in place on spigot 3 by means of a retaining band (not shown). In such an event, projection 19 serve the further purpose of fixing or securing the retaining band.

In the embodiment of FIGS. 2 and 3, socket 2 is designed with a window 20 which extends from socket end 5 and is divided by a radially extending central web 21 into two partial windows 22, 23. Windows 22, 23 and web 21 have about the same circumferential widths. In the circumferential direction, the total width of the window 20 corresponds to an integral fraction of the circumference of recess 6. In the present example window 20 is ⅛th the circumference of recess so that together 8 locking elements 17 can be accommodated in recess 6.

In the radial direction, partial windows or window portions 22, 23 have a height approximately corresponding to the height of the cross section of locking elements 17 in the area of their toroidal contact surface 13. Partial windows 22, 23 include introduction channels 24, indicated by broken lines in FIG. 2, of about the same radial height. This means that in the zone of introduction channels 24, conical surface 7 is interrupted, except for the zone of web 21.

Each locking element 17 has a width substantially corresponding to the width of window 20, as may be learned from FIG. 3. To avoid an obstruction by web 21 during the introduction, each locking element has an axially extending introduction recess 25 on its upper side, reducing the thickness of the element in the area substantially to that of tongue 18. Locking protrusions 26, 27 are thereby formed at either side having a cross section shown in FIG. 3. Surface 13 is defined on these protrusions.

The connection illustrated by FIGS. 2 and 3 is assembled as follows:

Spigot 3 is introduced into socket 2 until retaining collar 10 reaches about the end of recess 6. Thereupon, the locking elements are sequentially introduced through window 20 in the axial direction, and then shifted within recess 6 circumferentially.

Next, all the locking elements 17 are displaced in the circumferential direction through half the width of an element, so that, as shown in dash-dotted lines in FIG. 3, one of the locking projections 26 or 27 of a last introduced element comes into a position behind web 21 and can apply against a respective portion of the conical surface. Finally, the tongues 18 of locking element 17 are fixed in place on spigot 3 by means of a retaining band (not shown).

FIG. 2 shows a socket tube 1 having extreme dimension within the tolerance limits, thus the allowable maximum of inside diameters of slotted end 5 and recess 6, and minimum of outside diameter spigot 3. In addition, a misalignment of about 2° is shown between socket tube 1 and spigot 3. In spite of that, as may be learned from the figure, the toroidal contact surfaces 13 of locking elements 17 apply against conical surface 7 of socket 2 along a continuous contact line, and normals N to this line intersect with the surface area 12 of elements 17. Elements 17 cannot be fitted. Overloading of the sleeve connection is effectively prevented.

While specific embodiments of the invention have been shown and described in detail to illustrate the application of the principles of the invention, it will be understood that the invention may be embodied otherwise without departing from such principles.

LIST OF REFERENCE NUMERALS

A list of reference numerals with their related parts is here provided for ready reference:

1: socket tube
2: socket
3: spigot end
4: recess
5: socket end
6: recess
7: conical surface
8: stop surface
9: groove 10: retaining collar
11: locking part
12: cylindrical contact surface
13: portion of a toroidal surface
14: annular surface
15: slide surface
16: internal taper
17: locking element
18: tongue
19: projection
20: window
21: web
22,23: partial windows
24: introduction channel
25: introduction recess
26,27: locking protrusions
28: annular gap

What is claimed is:

1. A sleeve connector for connecting the ends of two tubes together, the tubes having a longitudinal axis, comprising:
   a socket adapted for association with one tube end to be connected, and having an annular recess bounded by a tapered surface tapering radially inwardly toward an end of said socket;
   a retaining collar adapted to be secured around another tube to be connected adjacent an end of the other tube;
   at least one locking member disposed in said socket recess and having a radially inner cylindrical contact surface adapted for engagement on the other tube and for engagement against said retaining collar, said locking member having a radially outer curved contact surface having a sectional toroidal shape for contact with said tapered surface, said sectional toroidal shape of said curved contact surface having a cross section with a diameter which is smaller than an axial length of said cylindrical contact surface for said locking member, and with all normal lines that can be drawn through said curved contact surface intersecting said cylindrical contact surface whereby forces exerted by said tapered surface on said curved contact surface are transmitted to said cylindrical contact surface;
   said tapered surface being conical and extending at an angle to said longitudinal axis so that no part of said locking member comes into contact with said conical surface except for said curved contact surface having said sectional toroidal shape.

2. A sleeve connector according to claim 1, wherein said locking member includes an internal taper adapted for engagement against said retaining collar and tapering radially inwardly at an obtuse angle to an axis of said socket.

3. A sleeve connector according to claim 2, wherein said obtuse angle is about 85°.

4. A sleeve connector according to claim 1, wherein said conical surface extends at an angle to said longitudinal of less than 45°.

5. A sleeve connector according to claim 1, wherein said locking member comprises a single split ring extending around said annular recess of said socket, said recess having a deepest radial depth which is greater than a radial cross-sectional height of said locking member plus a radial cross-sectional height of said retaining collar whereby the end of the other tube can be passed into said split ring when said split ring is in said recess to spread said split ring to permit said retaining collar to pass under said split ring.

6. A sleeve connector according to claim 1, wherein said socket includes a window extending from the end of said socket to said annular recess, said at least one locking member having a circumferential length and a radial height for passing through said window into said recess, and a plurality of additional locking members each including a radially inner cylindrical contact surface and a radially outer curved contact surface having a sectional toroidal shape for contact with said tapered surface of said socket.

7. A sleeve connector according to claim 6, wherein each locking element includes a tongue extending axially out of said annular recess and beyond said end of said socket.

8. A sleeve connector according to claim 7, including at least one projection on each tongue whereby a tool can be engaged with each projection for moving each locking member.

9. A sleeve connector according to claim 8, wherein said a radial height of said introduction channel is substantially equal to a maximum radial depth of said annular recess.

10. A sleeve connector according to claim 6, wherein said window includes a radially inwardly extending web defining a window portion on either circumferential side thereof, each locking element having an introduction recess for permitting passage of said locking element through said window with said introduction recess passing under said web, said introduction recess having a substantially equal circumferential width to a circumferential width of said web.

11. A sleeve connector according to claim 10, wherein a circumferential length of said window portions is substantially equal to a circumferential length of said web.

12. A sleeve connector according to claim 6, wherein said tapered surface of said socket is interrupted only in the area of said window portions.

13. A sleeve connector according to claim 6, wherein each locking element is shaped for being held in place by a retaining ring.

14. A sleeve connector to be secured against any shift, for tubes and particularly socket tubes, with an annular recess (6) being provided in a socket (2) of one tube between the tube end and a seal ring for the tube and with the annular recess being bounded on its socket end side (5) by a conical surface (7) and accommodating at least one locking part (11,17) which applies radially against the conical surface (7), and, by a cylindrical contact surface (12) against a spigot end (3) of another tube introduced into the socket (2) and axially against the conical surface (7) and a retaining collar (10) surrounding the spigot, characterized in that a contact surface (13) associated with the conical surface (7) of the locking part (11,17) is formed by a portion of a toroidal surface and that all normal lines (N,N') to said contact surface (13) intersect with the cylindrical contact surface (12) which applies against the surface of the spigot (3); a diameter of a circular cross section of the toroidal surface (13) being smaller than an axial length of the cylindrical contact surface (12) of the locking part (11,17); and, on its front side remote from the socket end (5), the locking part (11,17) has an internally tapering contact surface (16) associated with the retaining collar (10); an angle of taper of the conical surface (7) of the socket (2) being less than 45° to an axis of the socket; an annular surface (14) adjacent the toroidal portion of the locking part, at the tube end (5) side of the locking part (11,17) having a contour ensuring that at any angular position of the spigot (3) relative to the socket (2), the annular surface 14 and the conical surface (7) of the socket (2) are spaced apart.

15. A sleeve connector according to claim 22, characterized in that the locking part (11) is a resilient and split ring, and that the recess (6) bounded by the conical surface (7) has a radial depth exceeding the radial cross sectional height of the locking part (11) plus the radial cross sectional height of the retaining collar (10).

16. A sleeve connector according to claim 22, characterized in that the socket tube is provided with a window (20) which extends from the socket end (5) up to the annular recess (6) and that the locking part comprises a plurality of locking elements (17) having each a width, in the circumferential direction of the recess (6), substantially corresponding to that of the window (20).

17. A sleeve connector according to claim 16, characterized in that each of the locking elements (17) comprises a tongue (18) extending through an annular gap (28) formed between the socket end (5) and the spigot (3), beyond the socket end (5) in the spigot direction, each have at least one projection (19) on their upper side, for engaging a tool, the window (20) having a radially extending web (12) delimiting two partial windows (22,23) and each of the locking elements (17) having an introduction recess (25) on its upper side, whose widths corresponds to that of the web (21), the widths of the web (21) and of each of the introduction recesses (25) substantially correspond to the width of each of the partial windows (22,23), the conical surface (7) of the recess (6) of the socket (2) being interrupted only in the zone of the partial windows (22,23) and the introduction channel (24) adjacent the partial windows (22,23) having a height corresponding to the maximum radial depth of the recess (6).

* * * * *